United States Patent [19]

Ishikawa

[11] Patent Number: 5,309,317
[45] Date of Patent: May 3, 1994

[54] DRAWOUT TYPE SWITCHGEAR INCLUDING LOCK MEMBER TO ALLOW CIRCUIT BREAKER TO BE POSITIONED IN THREE LOCKED POSITIONS

[75] Inventor: Takayoshi Ishikawa, Fukuyama, Japan

[73] Assignee: Mitsubishi Denki Kabushiki Kaisha, Tokyo, Japan

[21] Appl. No.: 981,066

[22] Filed: Nov. 24, 1992

[30] Foreign Application Priority Data

Feb. 26, 1992 [JP] Japan .................. 4-008743[U]
Feb. 27, 1992 [JP] Japan .................. 4-041168

[51] Int. Cl.⁵ .............................................. H02B 1/04
[52] U.S. Cl. .............................. 361/609; 200/50 AA; 200/325; 361/726
[58] Field of Search .............. 211/41; 307/147-149; 200/50 AA, 50 R:48 R, 148 R, 148 B, 318, 325; 361/335-338, 339, 343, 391, 393, 394, 399, 415, 605-609, 614, 615, 724-727, 736, 796, 801

[56] References Cited

U.S. PATENT DOCUMENTS

| Re. 25,243 | 9/1962 | Kobitter . | |
|---|---|---|---|
| 1,684,889 | 9/1928 | Russ . | |
| 2,809,086 | 10/1957 | Fall . | |
| 2,850,916 | 9/1958 | Kingdon . | |
| 2,862,772 | 12/1958 | Gussack . | |
| 2,865,685 | 12/1958 | Fall . | |
| 3,483,338 | 12/1969 | Bould et al. ............... | 200/50 AA |
| 4,412,112 | 10/1983 | Ishikawa et al. ........... | 200/50 AA |
| 4,486,814 | 12/1984 | Ishikawa .................... | 361/339 |
| 4,489,362 | 12/1984 | Castonguay ................ | 361/339 |

FOREIGN PATENT DOCUMENTS

| 2343802 | 4/1974 | Fed. Rep. of Germany ...... 361/391 |
|---|---|---|
| 2641833 | 12/1977 | Fed. Rep. of Germany . |
| 2908391 | 10/1979 | Fed. Rep. of Germany . |
| 8235124 | 4/1983 | Fed. Rep. of Germany . |
| 1016344 | 1/1966 | United Kingdom . |
| 1188190 | 4/1970 | United Kingdom . |

OTHER PUBLICATIONS

C. Mueller, "Slide and Lacing Strip for Telephone Exchange Framework", *Western Electric Technical Digest*, No. 13, Jan. 1969, pp. 31 and 32.

*Primary Examiner*—Gerald P. Tolin
*Attorney, Agent, or Firm*—Burns, Doane, Swecker & Mathis

[57] ABSTRACT

The sliding mechanism (50) of a drawout type switchgear has a first slide arm (5) which is slidably supported by the upper and lower support rails (3A, 3B) and a second slide arm (7) which is slidably supported by the first slide arm (5). The second slide arm (7) is interlocked with the first slide arm (5) by a lock plate (12) when the first slide arm (5) is sliding from a connected position to a final drawout position of the first slide arm (5). When the first slide arm (5) reaches the final drawout position of the first slide arm (5), the interlocked second slide arm (7) is released by rotation of the lock plate (12).

17 Claims, 19 Drawing Sheets

DRAWOUT TYPE SWITCHGEAR INCLUDING LOCK MEMBER TO ALLOW CIRCUIT BREAKER TO BE POSITIONED IN THREE LOCKED POSITIONS

FIELD OF THE INVENTION AND RELATED ART STATEMENT

1. Field of the Invention

The present invention relates to a drawout type switchgear. More particularly, it concerns a drawout type switchgear that comprises a base frame, a pair of support rails mounted on both sides of the base frame, a slide frame slidably held by the support rails and a circuit breaker supported by the slide frame.

2. Description of the Related Art

A drawout type switchgear of this kind having the above-mentioned construction is disclosed in the Japanese published examined utility model publication (Jikko) Sho 63-5384.

In the conventional drawout type switchgear of this kind, if the circuit breaker is designed to have a long extension stroke or interval by means of a long slide frame, maintenance and inspection of the drawout type switch at the drawout position of the circuit breaker which is fully removed from the base frame could easily be accomplished.

However, in order to achieve a small sized drawout type circuit breaker, the slide frame for drawing out the circuit breaker can not be designed to have a long extension interval. Consequently, it is hard to conduct the maintenance and the inspection of the small sized drawout type circuit breaker because the circuit breaker can not be fully removed from the base frame.

OBJECT AND SUMMARY OF THE INVENTION

The present invention has been made in order to solve the above-mentioned problem. An object of the present invention is to provide a drawout type switchgear of which maintenance and inspection can be easily conducted in spite of a small sized configuration.

In order to achieve the above-mentioned object, the drawout type switchgear of the present invention comprises:
  a base frame having at least one side plate,
  a circuit breaker, which is movably mounted on the base frame, and which is to be locked at plural positions of a connected position, a disconnected position and a drawout position,
  a pair of upper and lower support rails which are mounted on said at least side plate of the base frame,
  a first slide arm which is slidably supported by the upper and lower support rails,
  a second slide arm which is slidably supported by the first slide arm, and which is fixed to the circuit breaker, and
  at least one lock member which lock the second slide arm to the first slide arm until the first slide arm reaches a final drawout position of said first slide arm, and which release by overlapping the second slide arm and the first slide arm.

According to the above-mentioned drawout type switchgear of the present invention, maintenance and inspection are easily conducted in spite of the small sized configuration because the drawout type switchgear comprises a small sized slide frame having a long extension interval.

Further, according to the drawout type switchgear of the present invention, a circuit breaker can be locked at a disconnected position without fail, and is prohibited from projecting in a drawout direction due to a shock or a shake. Therefore, manufacture of the drawout type switchgear can be realized with a high reliability.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all the Figures are schematic representations for purposes of illustration and do not necessarily depict the actual relative sizes or locations of the elements shown.

DESCRIPTION OF THE PREFERRED EMBODIMENTS

In the following paragraphs, the present invention will be described in detail concerning the preferred embodiments shown in the attached drawings.

First Embodiment

Hereafter, a first embodiment of a drawout type switchgear in accordance with the present invention is described concerning the accompanying drawings of FIGS. 1 to 7.

Figure 1:
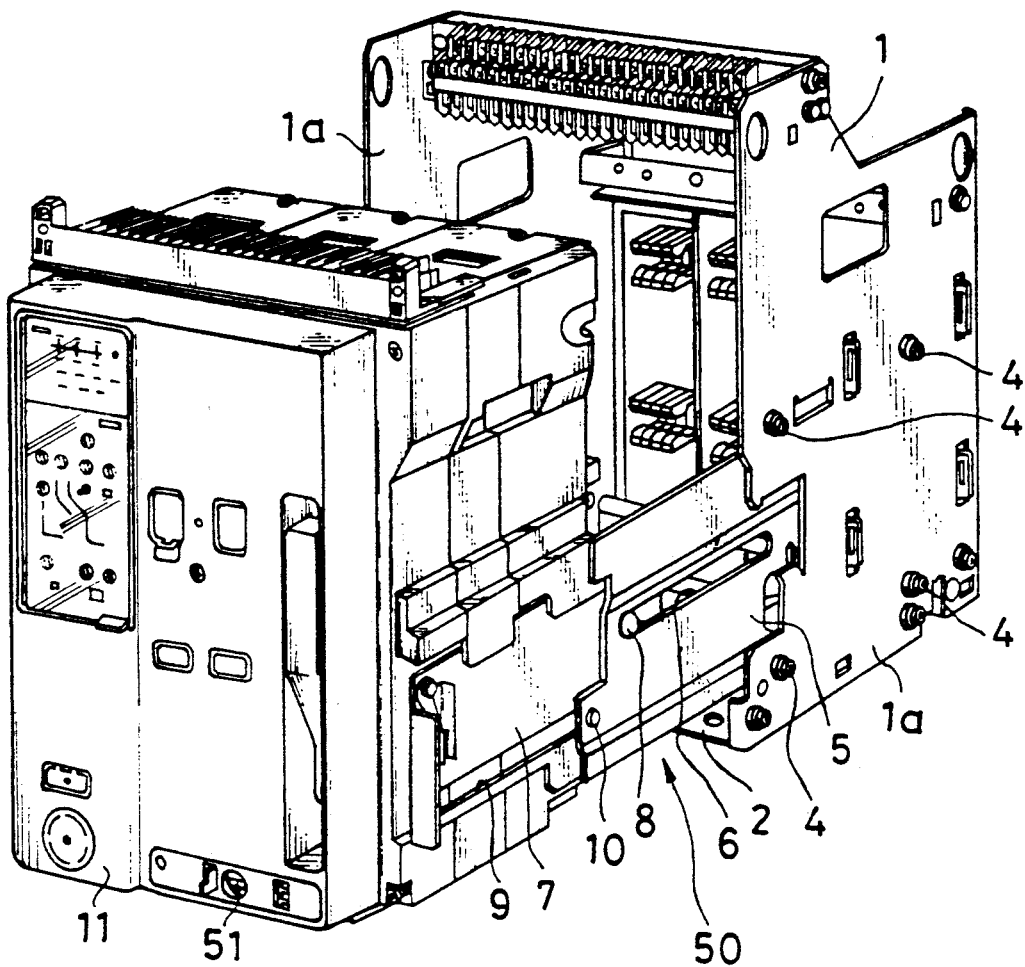
FIG. 1 is a perspective view of the drawout type switchgear of a first embodiment in accordance with the present invention in its drawout state.
Figure 2:
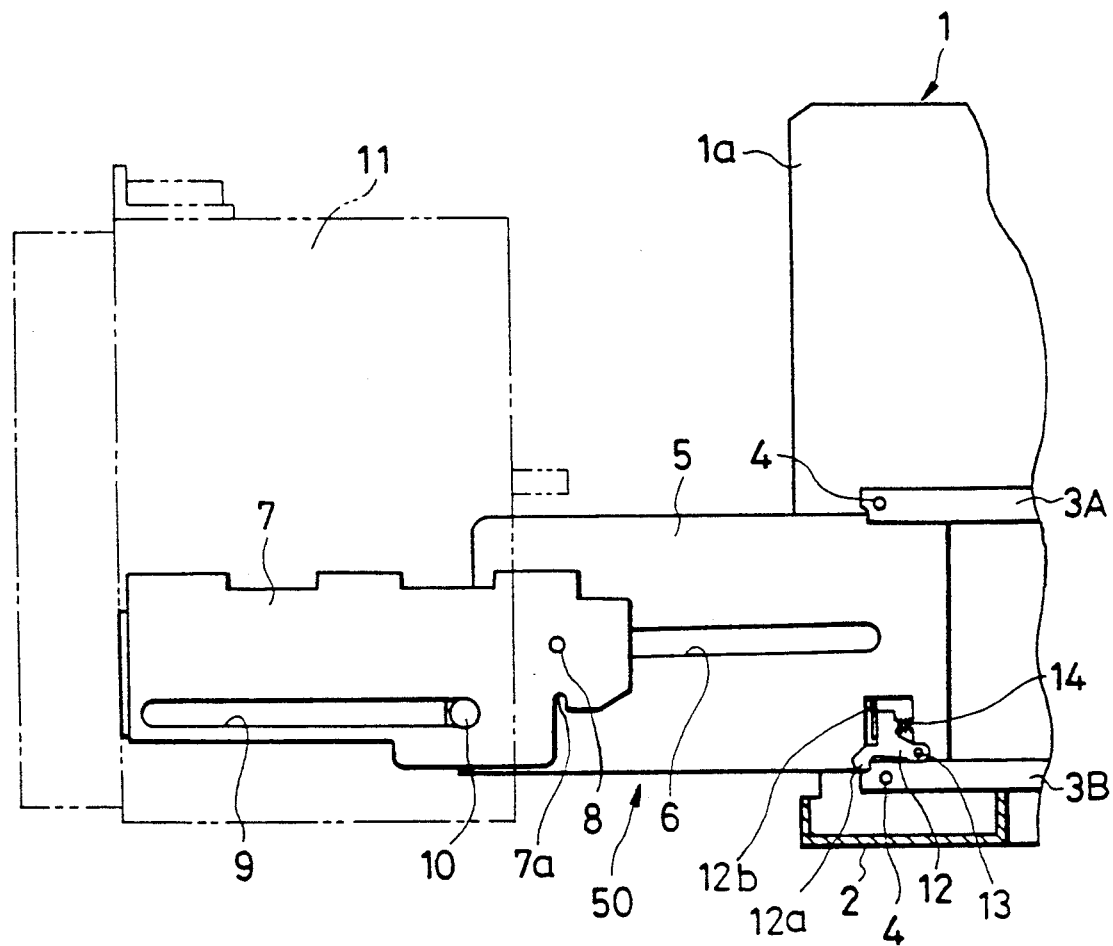
FIG. 2 is a side view showing an inner face of a sliding mechanism of the drawout type switchgear of FIG. 1.
Figure 3:
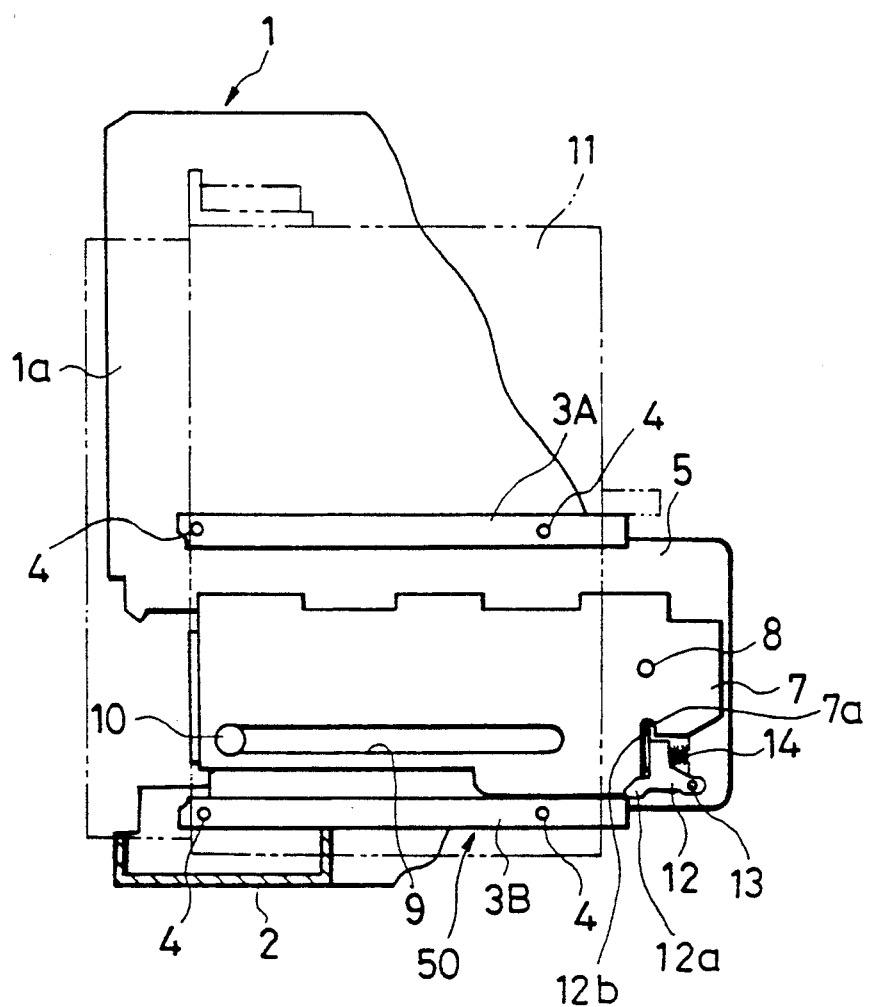
FIG. 3 is a side view showing the main part of the sliding mechanism in a connected state before a circuit breaker is drawn out from a base frame of the drawout type switchgear of FIG. 1.
Figure 4:
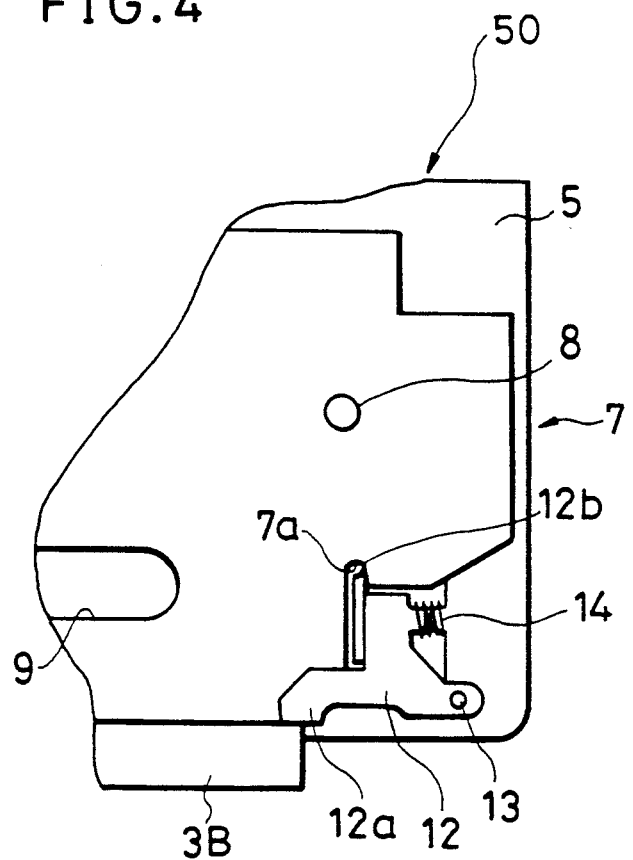
FIG. 4 is a side view showing a lock members of the sliding mechanism of FIG. 3.
Figure 5:
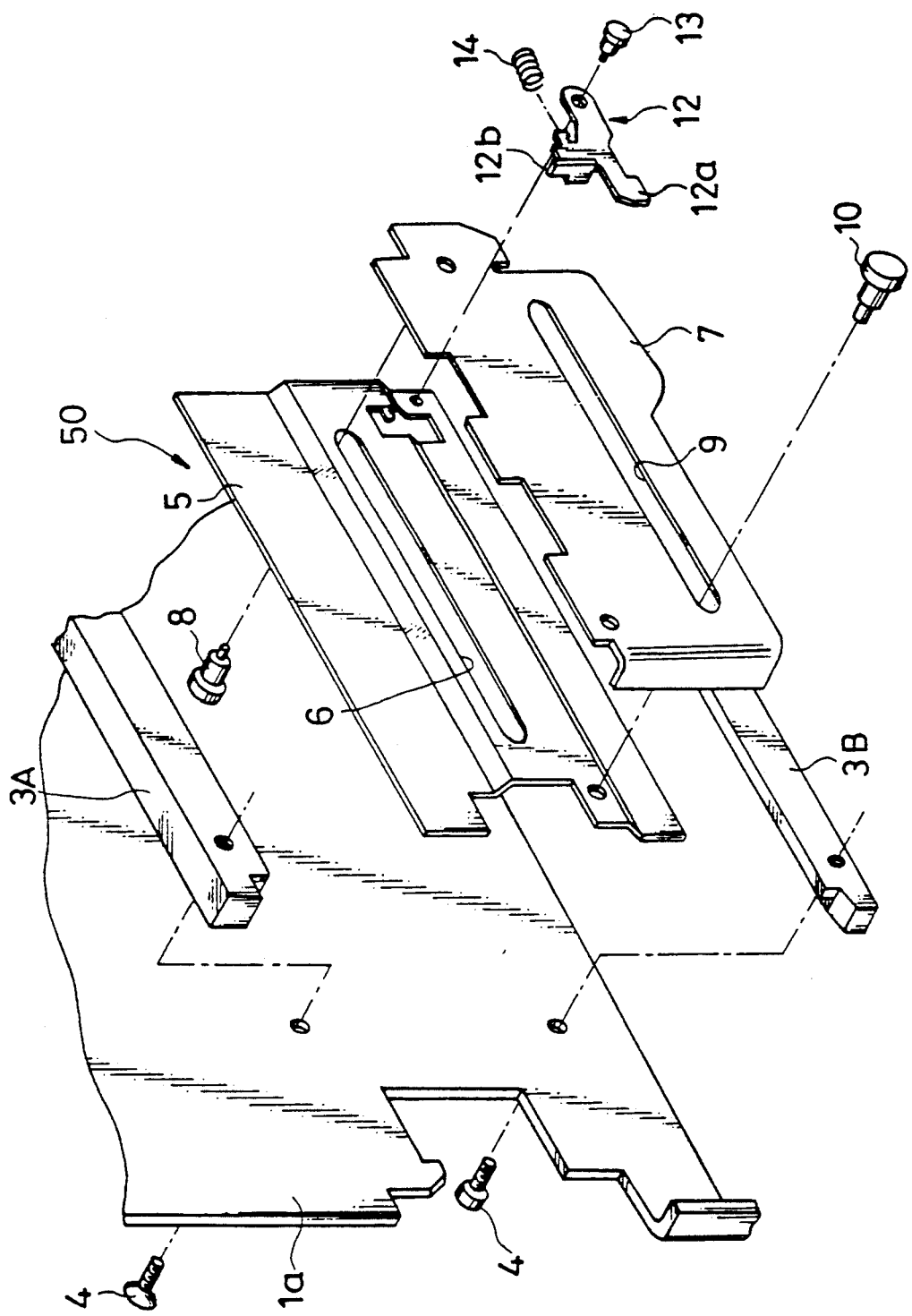
FIG. 5 is an exploded perspective view showing the sliding mechanism of FIG. 3.
Figure 6:
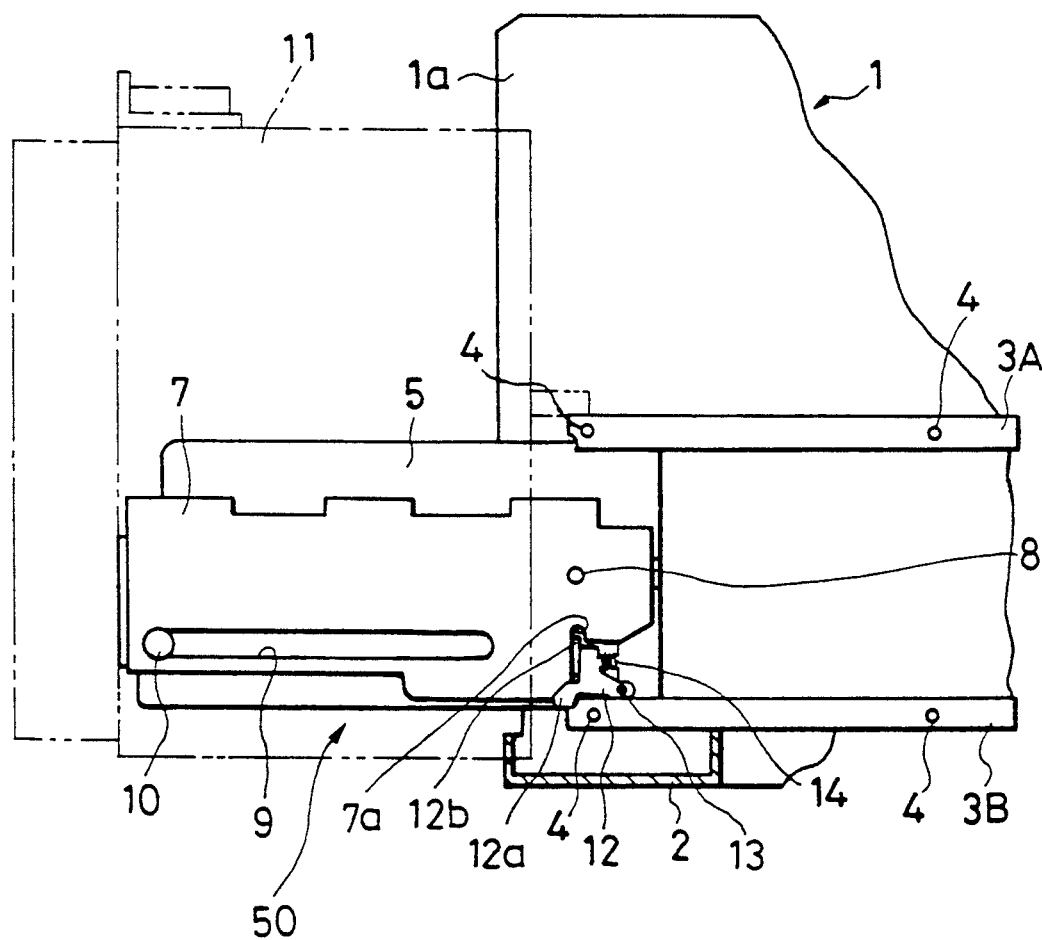
FIG. 6 is a side view showing the main part of the sliding mechanism in an intermediate state of a drawing operation of the drawout type switchgear of FIG. 1.
Figure 7:
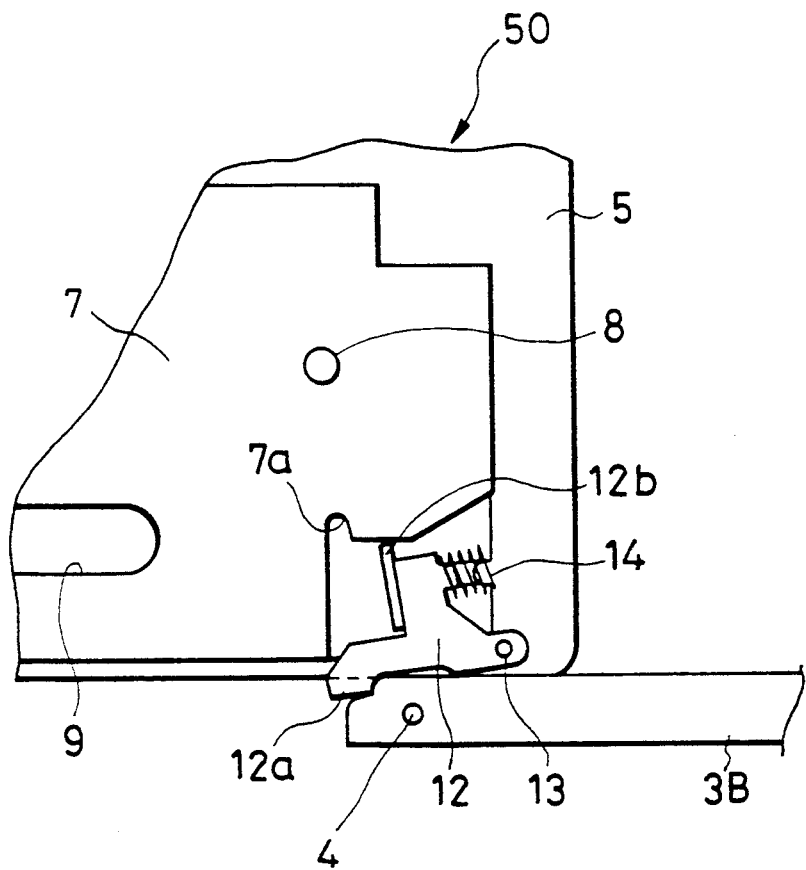
FIG. 7 is a side view showing the lock mechanism of the sliding mechanism of FIG. 6.

FIG. 1 is a perspective view of the drawout type switchgear of the first embodiment in a drawout state wherein a circuit breaker 11 is drawn out from the base frame 1. FIG. 2 is a side view showing an inner face of a sliding mechanism 50 of the drawout type switchgear. FIG. 3 is a side view showing the sliding mechanism 50 in a connected state before a circuit breaker 11 is drawn out from a base frame 1. FIG. 4 is a side view showing a lock plate 12 in the sliding mechanism 50 of FIG. 3. FIG. 5 is an exploded perspective view showing the sliding mechanism 50 of FIG. 3. FIG. 6 is a side view showing the sliding mechanism 50 in an intermediate state of a drawing-out operation. FIG. 7 is a side view showing the lock plate 12 of the sliding mechanism 50 of FIG. 6.

As shown in FIG. 1, the base frame 1 of the drawout type switchgear slidably receives the circuit breaker 11 supported by the sliding mechanism 50. The circuit breaker 11 can be drawn out from or pushed into the base frame 1 by an operation of a drawout/push-in unit 51 to which a detachable handle (not shown) is connected when the circuit breaker 11 is drawn out or pushed into the base frame 1. The drawout type switchgear has a locking unit (not shown) which can lock the circuit breaker 11 at three positions, namely a "connected position" a "disconnected position" a "drawout position". (i) When the circuit breaker 11 is locked at the "connected position", the circuit breaker 11 is entirely received within the base frame 1, and both of a main circuit and a control circuit in the drawout type switchgear are in a connected state. (ii) When the circuit breaker 11 is locked at the "disconnected position", the circuit breaker 11 can be slid in a drawout direction from the connected position, and then, both of the main circuit and the control circuit are in a disconnected state. (iii) When the circuit breaker 11 is locked at the "drawout position", the circuit breaker 11 is fully removed from the base frame 1.

In FIG. 2 which shows the sliding mechanism 50, a pair of an upper support rail 3A and a lower support rail 3B are mounted on inner faces of both side plates 1a, 1a of the base frame 1 by means of screw bolts 4. Both side plates 1a, 1a are supported to each other by an angle bar 2 connecting them.

Each embodiment is described and shown in the drawings with respect to one side of the circuit breaker. However, it is understood that the locking mechanism according to the present invention is provided on both side plates 1a, 1a of the base frame.

A first slide arm 5, which is formed to have a first slot 6, is slidably supported by the pair of the upper support rail 3A and the lower support rail 3B as shown in FIGS. 2 and 3. A second slide arm 7 having a second slot 9 is disposed along the first slide arm 5, and is slidably supported by the first slide arm 5. A first support pin 8, which is provided at a rear portion (right side portion in FIG. 2) of the second slide arm 7, is slidably engaged with the first slot 6 of the first slide arm 5. A second support pin 10, which is provided at a front portion (left side portion in FIG. 2) of the first slide arm 5, is slidably engaged with the second slot 9 of the second slide arm 7. Therefore, the circuit breaker 11, which is fixed to the second slide arm 7, can be drawn out from or pushed into the base frame 1. The lock plate 12 is provided on an inner or a rear portion (right side portion in FIG. 2) of the first slide arm 5 pivotaly about a pivot pin 13. The lock plate 12 has a hook 12a forwardly projecting and a projection 12b upwardly projecting. The lock plate 12 is urged by a lock spring 14 in a manner to be always biased in a counterclockwise direction about the pivot pin 13 as shown in FIG. 5.

Next, drawing-out operation of the above-mentioned drawout type switchgear of the first embodiment is described concerning FIGS. 2 to 7.

In the connected state that the circuit breaker 11 is inserted in the base frame 1 as shown in FIG. 3, the hook 12a of the lock plate 12 is abutted to an upper face of the lower support rail 3B, and hence the projection 12b of the lock plate 12 is engaged with a recess 7a of the second slide arm 7. FIG. 4 shows the lock plate 12 in the above-mentioned condition. As a result, the second slide arm 7 is interlocked with the first slide arm 5 in a manner to slide between the upper support rail 3A and the lower support rail 3B. Accordingly, when the circuit breaker 11 is moved from the connected position shown in FIG. 3 to an intermediate position shown in FIG. 6, the first slide arm 5 and the second slide arm 7 slide together.

As shown in FIGS. 6 and 7, when the first slide arm 5 reaches an intermediate position in the drawing-out operation, that is at a final drawout position of the first slide arm 5, the hook 12a of the lock plate 12 has come off the front end (left ends of the drawings) of the lower support rail 3B; and then the lock plate 12, which is urged by the lock spring 14 in a counterclockwise direction, is rotated. As a result, the projection 12b of the lock plate 12 comes out of the recess 7a of the second slide arm 7. Only the first slide arm 5 at this intermediate position is inhibited from being further drawn out by a known stopper unit.

When the circuit breaker 11 is further drawn out from the above-mentioned intermediate position, only the second slide arm 7 supporting the circuit breaker 11 slides so as to remove from the base frame 1 as shown in FIG. 2. In this drawing-out operation, that is while only the second slide arm 7 is sliding, the first support pin 8 mounted on the second slide arm 7 travels in the first slot 6 of the first slide arm 5, and simultaneously the second support pin 10 of the first slide arm 5 travels in the second slot 9 of the second slide arm 7. Consequently, the sliding mechanism 50 is fully extended, and the circuit breaker 11 is fully removed from the base frame 1 as shown in FIGS. 1 and 2.

In the above-mentioned drawing-out operation for the circuit breaker 11, the second slide arm 7 is moved along the first slide arm 5 after the first slide arm 5 is slid between the upper support rail 3A and the lower support rail 3B. Accordingly, the circuit breaker 11 is steadily and reliably removed from the base frame 1 by the sliding mechanism 50 comprising the first slide arm 5 and the second slide arm 7. And, the drawout type switchgear comprising this sliding mechanism 50 has an improved workability in maintenance operations and so on, and can realize a stabilization in the drawing-out operation.

In the following paragraphs, a push-in operation of the above-mentioned drawout type switchgear is described. In the first step of the push-in operation, the first slide arm 5 shown in FIG. 2 is inhibited from a sliding in a backward direction (rightward in FIG. 2) by abutting between the hook 12a of the lock plate 12 and the front end of the lower support rail 3B. Therefore, when the circuit breaker 11 is pushed into the base frame 1 in the above-mentioned first step of the push-in operation, only slide arm 7 is moved in the backward direction.

When the second slide arm 7 reaches the intermediate position shown in FIG. 6, the second slide arm 7 abuts the projection 12b of the lock plate 12. And the second slide arm 7 causes the lock plate 12 to pivot in the clockwise direction against the force of the lock spring 14. FIG. 7 shows the lock plate 12 just before the second slide arm 7 is abutted to the projection 12b. As a result, the hook 12a of the lock plate 12 comes off of the front end of the lower support rail 3B, and the projection 12b of the lock plate 12 is engaged with the recess 7a of the second slide arm 7. Consequently, the first slide arm 5 and the second slide arm 7 are interlocked therebetween, and are pushed into the base frame 1, thereby to enter into the connected state as shown in FIG. 3 and FIG. 4. And the circuit breaker 11 is locked at the connected position by the locking unit.

Second Embodiment

Hereafter, a second embodiment of a drawout type switchgear in accordance with the present invention is described with reference to the accompanying drawings of FIGS. 8 to 11. Corresponding parts and components to the first embodiment are shown by the same numerals and marks, and the description thereon made in the first embodiment similarly apply. Differences and features of this second embodiment from the first embodiment are as follows.

Figure 8:
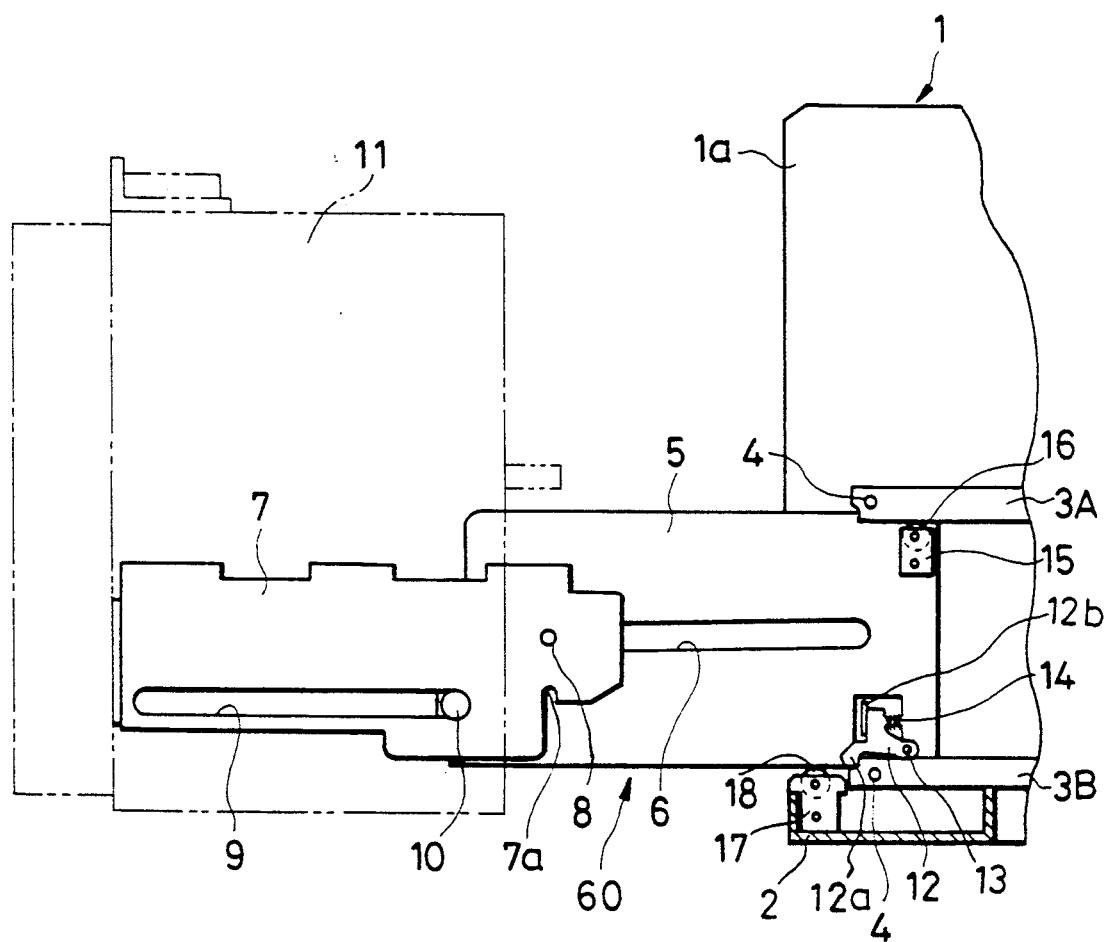
FIG. 8 is a side view showing an inner face of a sliding mechanism of a drawout type switchgear of a second embodiment in accordance with the present invention.
Figure 9:
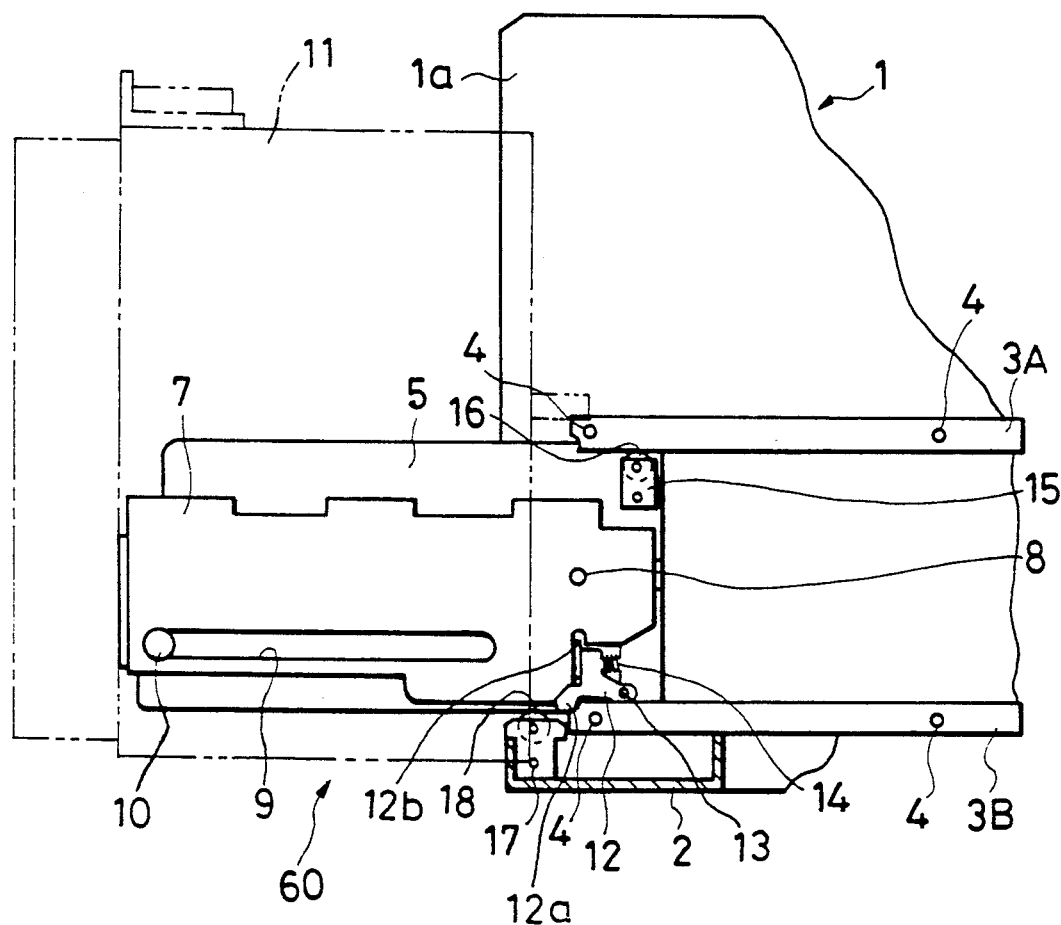
FIG. 9 is a side view showing the sliding mechanism in an intermediate state of a drawing operation of the drawout type switchgear of FIG. 8.
Figure 10:
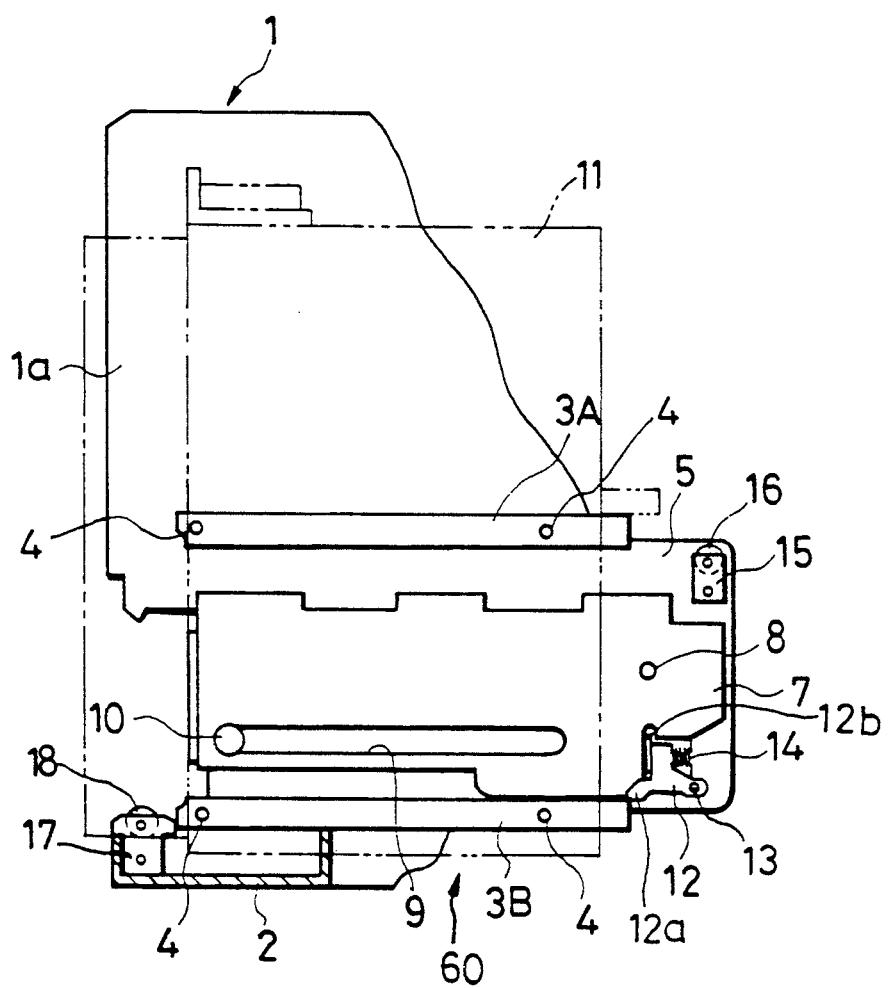
FIG. 10 is a side view showing the sliding mechanism in a connected state before a circuit breaker is drawn out from a base frame of the drawout type switchgear of FIG. 8.
Figure 11:
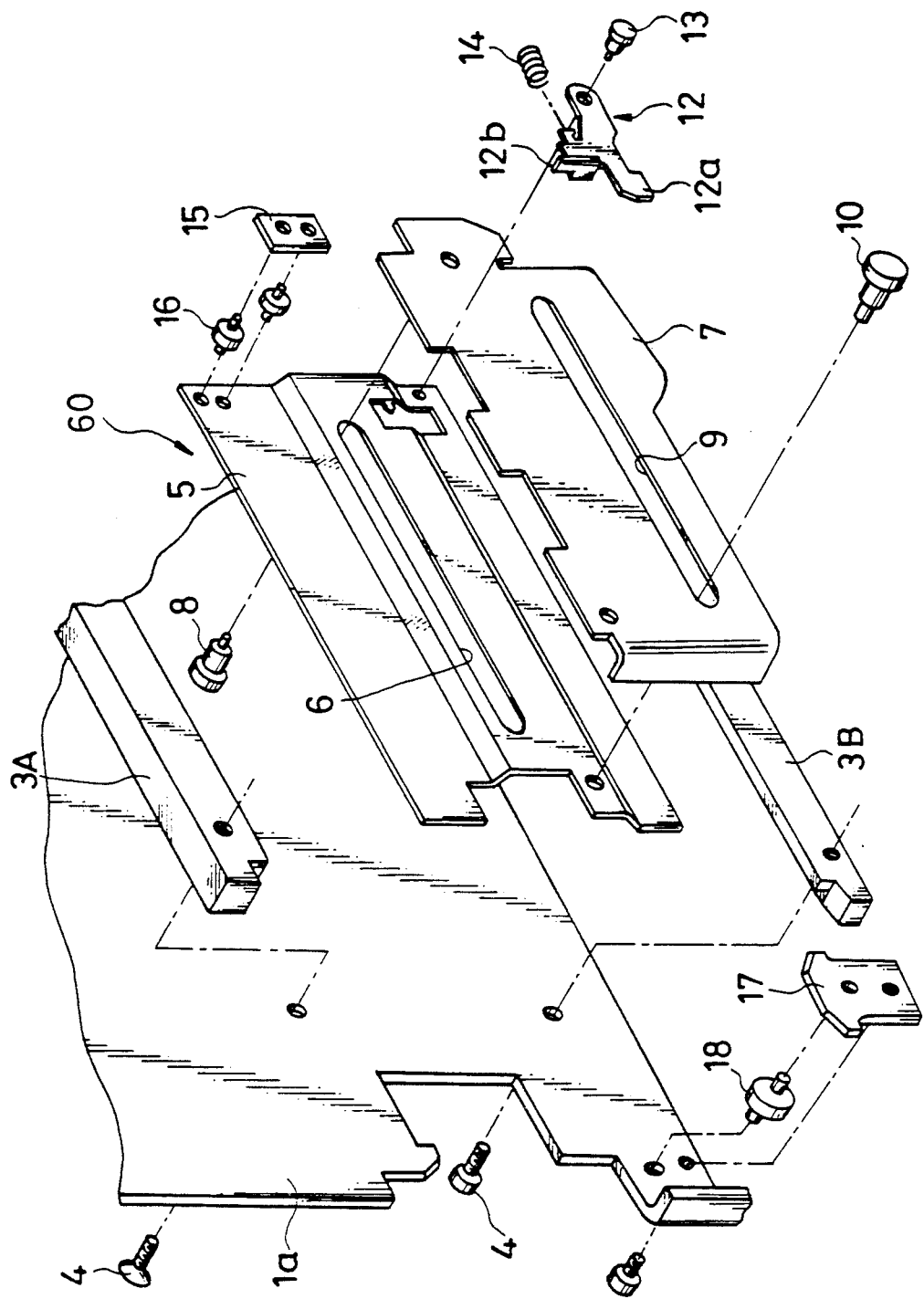
FIG. 11 is an exploded perspective view showing the sliding mechanism of FIG. 10.

FIG. 8 is a side view showing an inner face of the sliding mechanism 60 having the first sliding arm 5 and the second sliding arm 7 of a drawout type switchgear of the second embodiment. FIG. 9 is a side view showing the sliding mechanism 60 at the intermediate state in the drawout/push-in operation. FIG. 10 is a side view showing the sliding mechanism 60 in the connected state before the circuit breaker 11 is drawn out from the base frame 1. FIG. 11 is an exploded perspective view showing the sliding mechanism 60 shown in FIG. 10.

As shown in FIGS. 8 to 11, the sliding mechanism 60 of the drawout type switchgear comprises a first support roller 16, which is rotatably supported by a first bracket metal 15, and a second support roller 18, which is rotatably supported by a second bracket metal 17. The first support roller 16 is provided at an upper rear portion of the first sliding arm 5 so as to contact lower face of an upper support rail 3A. The second support roller 18 is provided at a lower front portion of the side plate 1a of the base frame 1, and is disposed at a lower position adjacent to the front end of the lower support rail 3B so as to contact the lower face of the first slide arm 5.

In the second embodiment, the first slide arm 5 is slidably supported by the first support roller 16 and the second support roller 18, as well as the pair of the upper support rail 3A and lower support rail 3B. Consequently, when the first slide arm 5 is sliding from the connected position shown in FIG. 10 to the intermediate position shown in FIG. 9 between a pair of upper and lower support rails 3A and 3B, the operational load in the drawout/push-in operation is received by rotation of the first support roller 16 and the second support roller 18. As a result, the drawout type switchgear of the second embodiment can realize a reduction of the operation load in the drawout and push-in operation of the circuit breaker 11, and has an improved workability.

Third Embodiment

Figure 12:
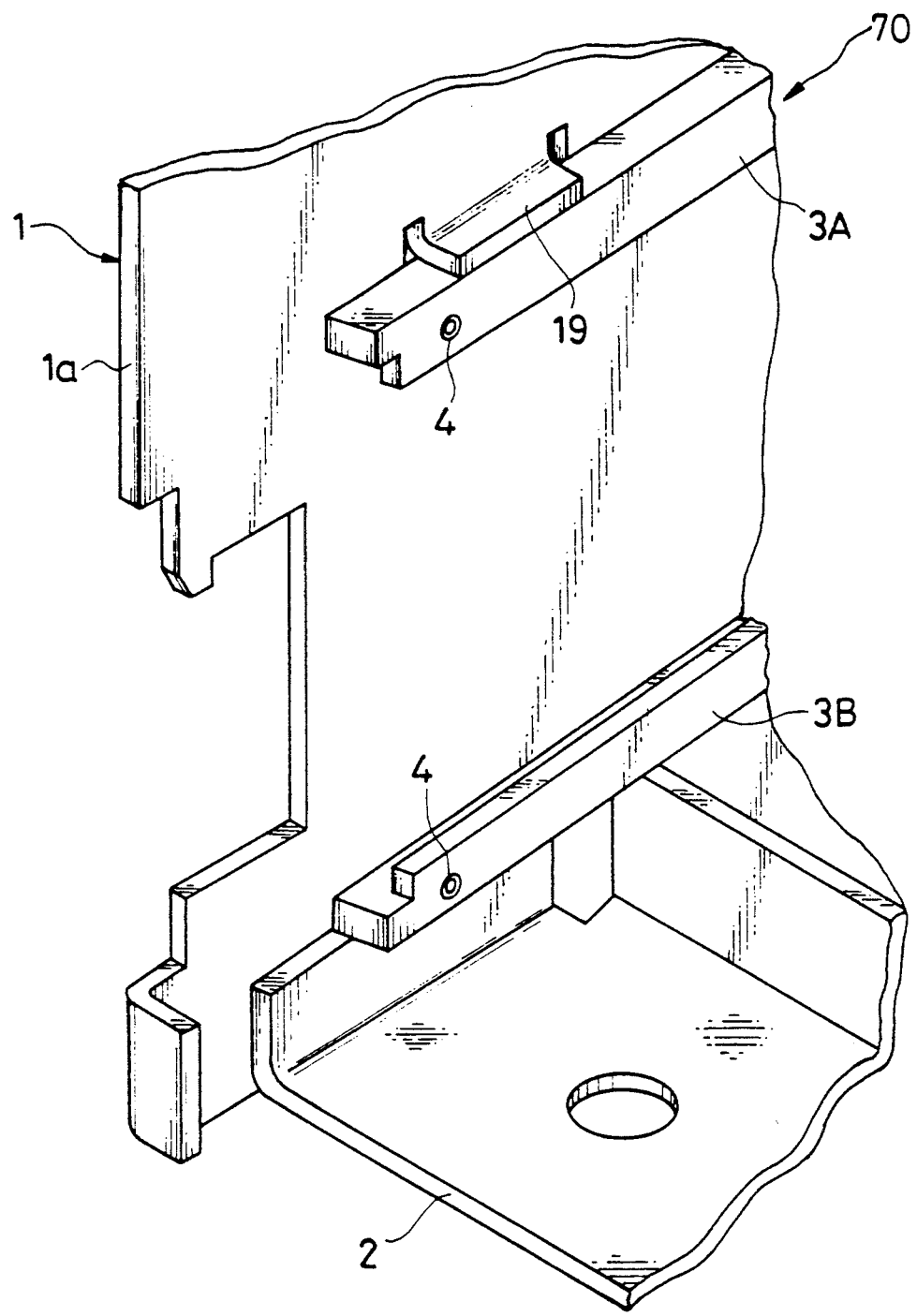
FIG. 12 is a perspective view showing a part of a sliding mechanism of a drawout type switchgear of a third embodiment in accordance with the present invention.

Hereafter, a third embodiment of a drawout type switchgear of the present invention is described referring to the accompanying drawing of FIG. 12. Corresponding parts and components to the first embodiment are shown by the same numerals and marks, and the description thereon made in the first embodiment similarly apply. Differences and features of this third embodiment from the first embodiment are as follows.

FIG. 12 is a perspective view showing the way of supporting the upper support rail 3A and the lower support rail 3B of a sliding mechanism 70 in the drawout type switchgear of the third embodiment.

As shown in FIG. 12, the lower support rail 3B is supported on and by the upper edge of the angle bar 2, which is firmly connected between the lower portions of both side plates 1a, 1a of the base frame 1. And the upper support rail 3A is supported by a bent plate 19 which resists the lifting force caused by the moving of the first slide arm 5 supporting the circuit breaker 11. The bent plate 19 is formed by bending a cut portion of the side plate 1a of the base frame 1. As a result, the upper support rail 3A and the lower support rail 3B in the third embodiment have respective strengthened support constructions, which is free from error of rail positions. Therefore the drawout type switchgear of the third embodiment realizes the high reliability of the manufactured product.

Fourth Embodiment

Figure 13:
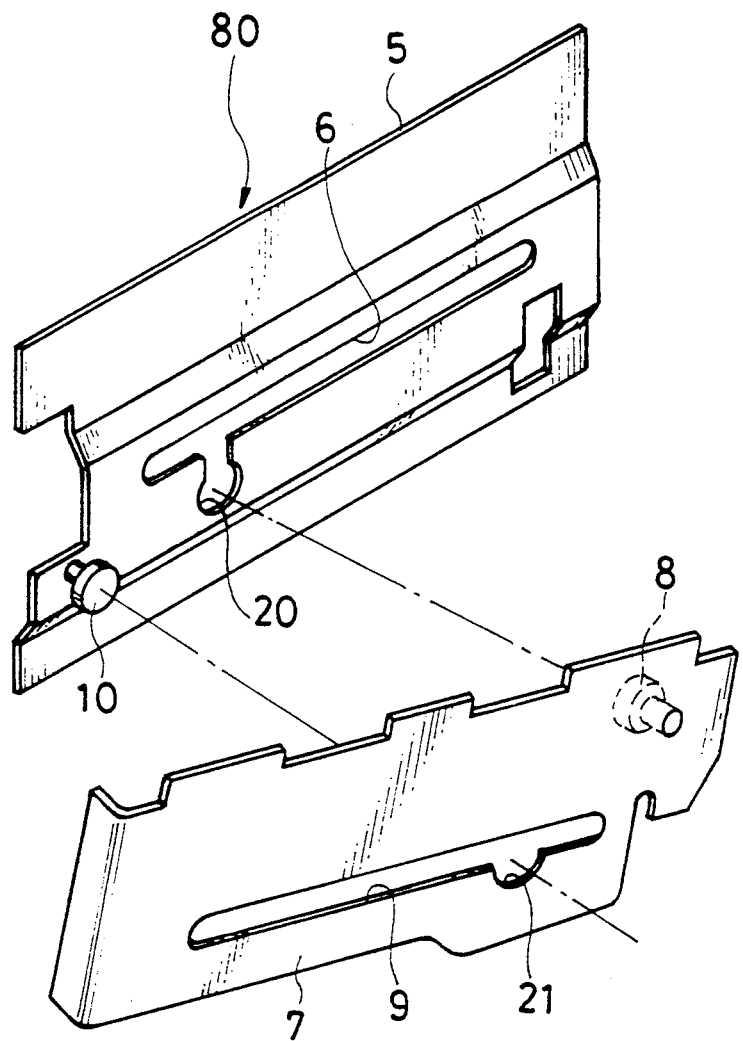
FIG. 13 is a perspective view showing a part of a sliding mechanism of a drawout type switchgear of a fourth embodiment in accordance with the present invention.

Hereafter, a fourth embodiment of a drawout type switchgear of the present invention is described referring to the accompanying drawing of FIG. 13. Corresponding parts and components to the first embodiment are shown by the same numerals and marks, and the description thereon made in the first embodiment similarly apply. Differences and features of this fourth embodiment from the first embodiment are as follows.

FIG. 13 is a partly perspective view showing the first slide arm 5 and the second slide arm 7 of a sliding mechanism 80 in the drawout type switchgear of the fourth embodiment.

As shown in FIG. 13, the first slot 6 of the first slide arm 5 is formed to have a large notch 20 extended downward therefrom; and the second slot 9 of the second slide arm 7 is formed to have a notch 21 extended downward therefrom. The large notch 20 is provided to receive a head of the first support pin 8 for assembling of the sliding mechanism 80. The notch 21 is provided similarly to receive a head of the second support pin 10 during assembling. As a result, in the assembling process of the sliding mechanism 80, the second slide arm 7 can be fitted with the first slide arm 5 after attachment of the first slide arm 5 to the pair of the upper support rail and the lower support rail mounted on the base frame 1. Accordingly, the drawout type switchgear of the fourth embodiment has an improved workability in the assembling process.

Fifth Embodiment

Hereafter, a fifth embodiment of a drawout type switchgear of the present invention is described referring to the accompanying drawing of FIGS. 14 to 19. Corresponding parts and components to the first embodiment are shown by the same numerals and marks, and the description thereon made in the first embodiment similarly apply. Differences and features of this fifth embodiment from the first embodiment are as follows.

Figure 14:
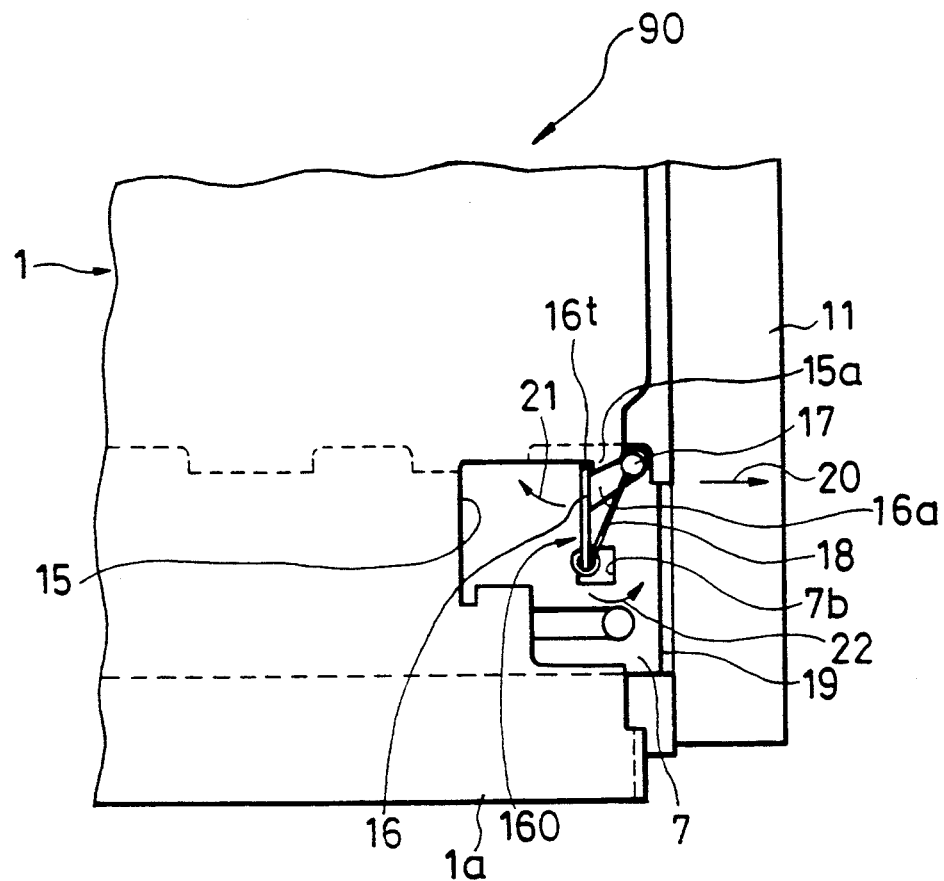
FIG. 14 is a side view showing a part of a lock lever unit of a drawout type switchgear of a fifth embodiment in accordance with the present invention.
Figure 15:
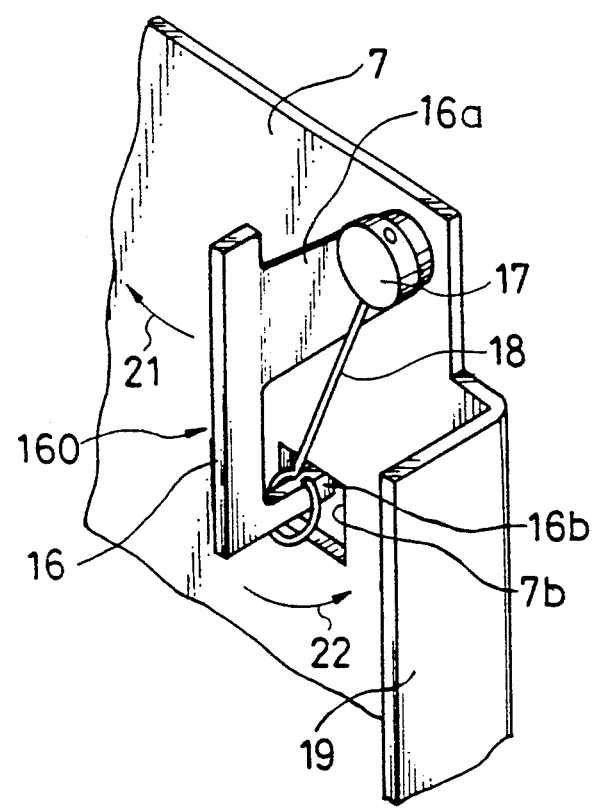
FIG. 15 is a perspective view showing the lock lever unit of FIG. 14.
Figure 16:
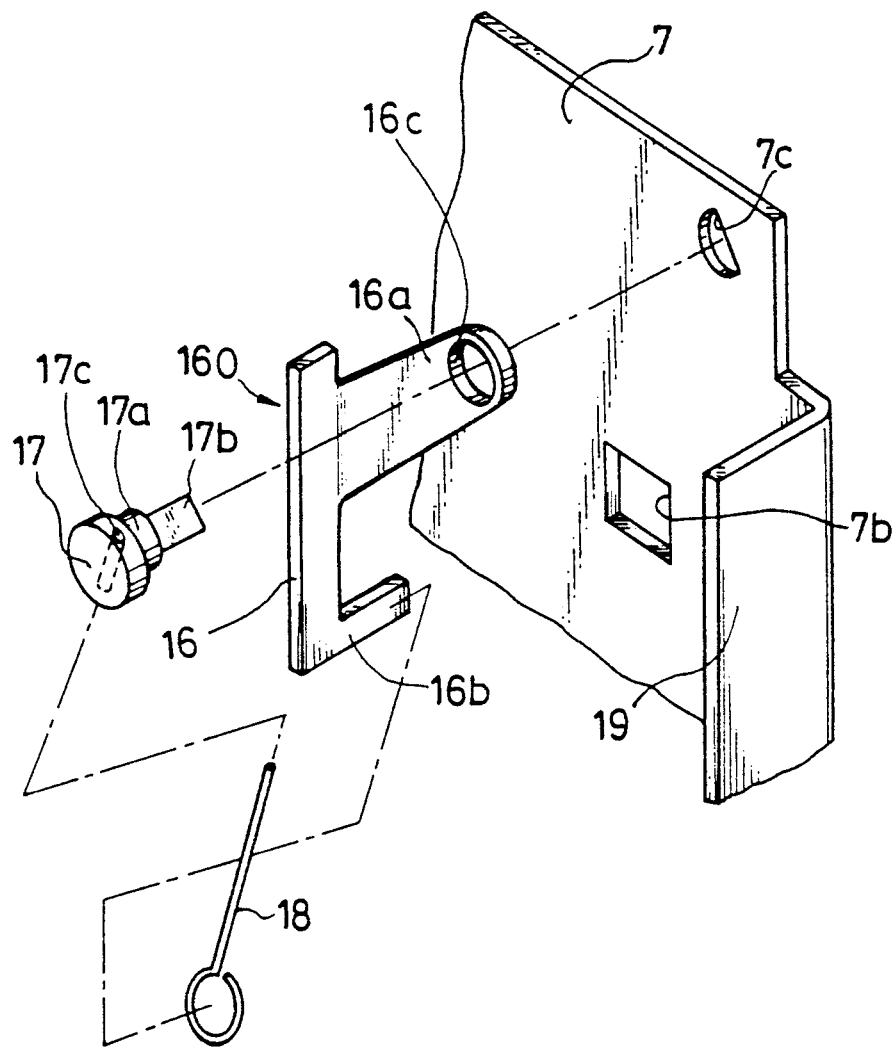
FIG. 16 is an exploded perspective view showing the lock lever unit of FIG. 15.

FIG. 14 is a side view showing a part of the side plate 1a of the base frame 1 in the drawout type switchgear of fifth embodiment. FIG. 15 is a perspective view showing a lock lever unit 160 provided on the second slide arm 7 of the drawout type switchgear of the fifth embodiment. FIG. 16 is an exploded perspective view showing the lock lever unit 160 of FIG. 15.

In FIG. 14, which shows the drawout type switchgear in the disconnected state, the side plate 1a of the base frame 1 is formed to have a cutoff part 15 at the front portion of the side plate 1a. The cutoff part 15 has at its back end part a projection 15a which is for engagement with an upper end of a lock lever 16. As shown in FIGS. 15 and 16, the lock lever 16, which comprises an arm portion 16a having a journal hole 16c and an end portion 16b, is mounted rotatably on an outer face of the second slide arm 7. The lock lever 16 is rotatably held by a support pin 17, which is fixed to the second slide arm 7 through the journal hole 16c of the lock lever 16. The end portion 16b of the lock lever 16 is engaged with an edge of a square hole 7b, which is configured in the second slide arm 7. The end portion 16b of the lock lever 16 is biased in a direction shown by an arrow 21 of FIG. 15 by a spring 18 engaging across the support pin 17 and the end portion 16b. As shown in FIG. 16, the support pin 17 has a head having a lateral through-hole 17c for receiving one end of the spring 18, a supporting portion 17a for rotatably journaling the lock lever 16 and a semicircular shaft 17b for fixing to a semicircular hole 7c of the second slide arm 7. A handle 19 is formed by bending the front end of the second slide arm 7 for manually drawing-out or pushing-in the base frame 1.

Next, drawing-out operation of the above-mentioned drawout type switchgear of the fifth embodiment is described referring to FIGS. 14, 17, 18 and 19.

Figure 17:
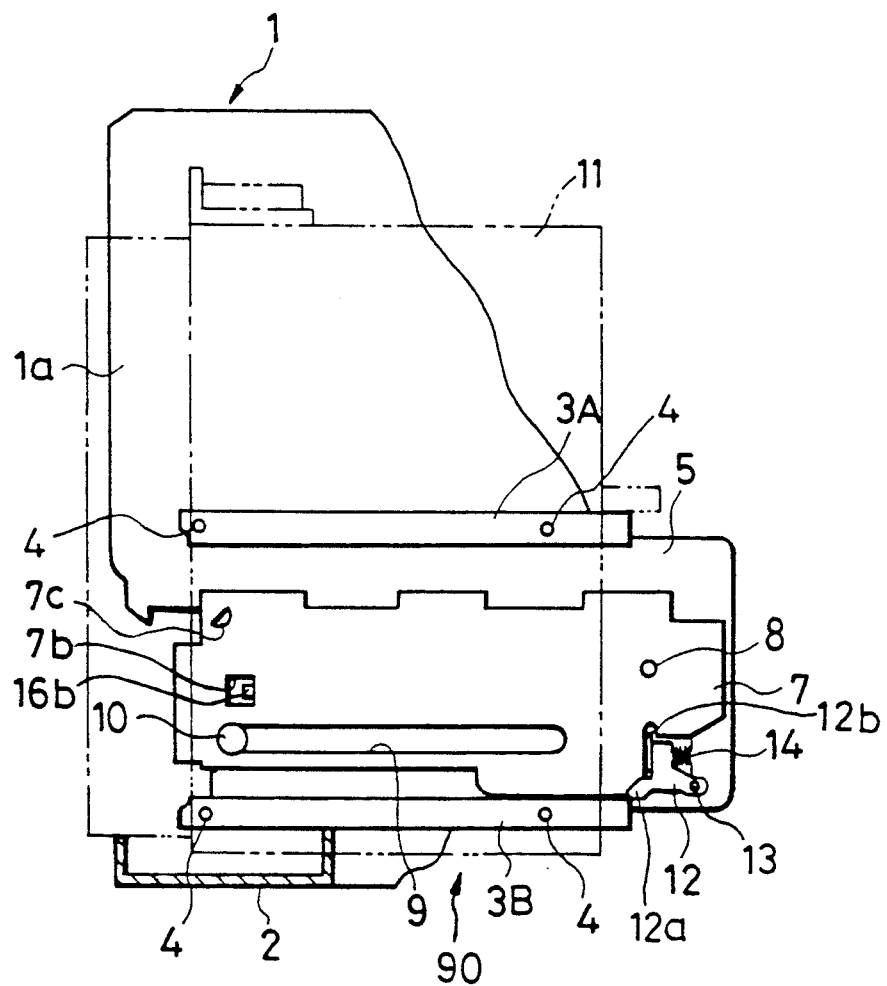
FIG. 17 is a side view showing an inner face of a sliding mechanism of FIG. 14.
Figure 18:
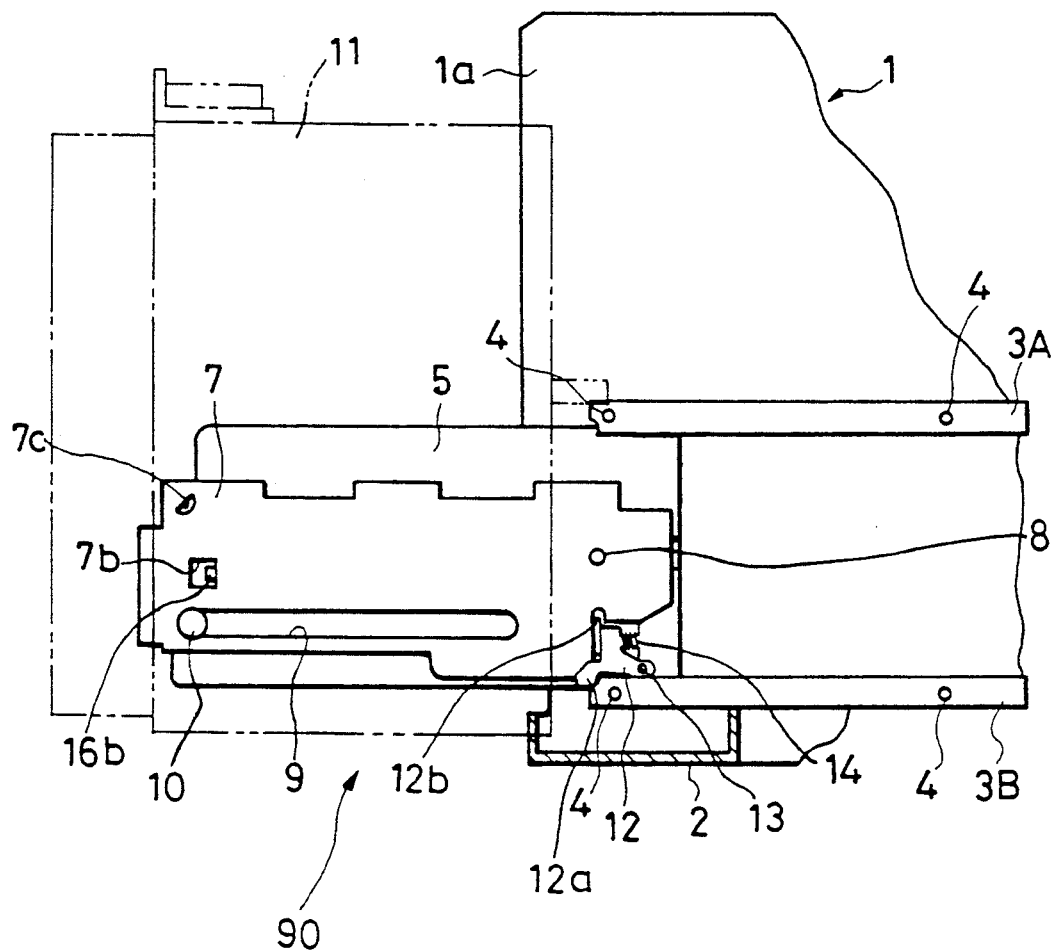
FIG. 18 is a side view showing an intermediate state of the sliding mechanism of FIG. 17.
Figure 19:
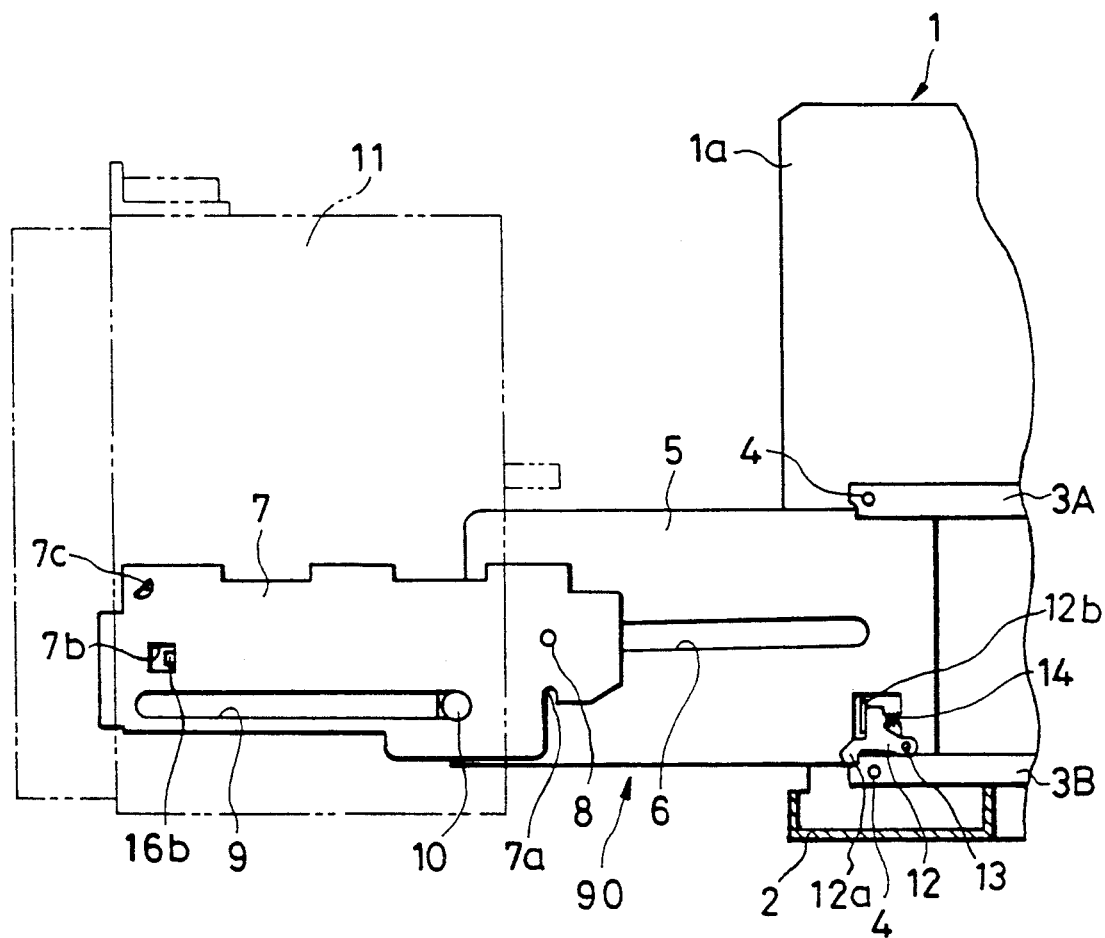
FIG. 19 is a side view showing a disconnected state of the sliding mechanism of FIG. 17.

FIG. 17 is a side view showing an inner face of the sliding mechanism 90 in the connected state as same as the aforementioned state shown in FIG. 4. FIG. 18 is a side view showing the sliding mechanism 90 in the intermediate state, and FIG. 19 is a side view showing the disconnected state.

In the connected state shown in FIG. 17, that is the circuit breaker 11 is fully inserted to the base frame 1, the hook 12a of the lock plate 12 is abutted to the upper face of the lower support rail 3B. Therefore, the projection 12b of the lock plate 12 is engaged with the recess 7a of the second slide arm 7. As a result, the first slide arm 5 and the second slide arm 7 are interlocked to be slid together, similarly to the interlocking mechanism in the aforementioned first embodiment. When the circuit breaker 11 is drawn out from the connected position (FIG. 17), the first slide arm 5 and the second slide arm 7 slides out of the base frame 1 to be supported by the upper support rail 3A and the lower support rail 3B.

When the circuit breaker 11 in the base frame 1 reaches the disconnected position shown in FIG. 14, the lock lever 16, which is biased by the spring 18 in a direction indicated by an arrow 21 of FIG. 14, is engaged with the projection 15a of the side plate 1a. In this disconnected state, though the circuit breaker 11 can be returned to be inserted to the base frame 1, the circuit breaker 11 is prevented from being drawn out in a drawout direction indicated by an arrow 20 of FIG. 14 because the lock lever 16 can not be turned in a direction indicated by an arrow 22 of FIG. 14. Consequently, it is prevented that the circuit breaker 11 in the disconnected state project from the base frame 1 in the direction indicated by the arrow 20 due to an unexpected force of a shock, vibrations and the like.

When the circuit breaker 11 is drawn out of the base frame 1 in order to conduct maintenance, inspection and so on, the operator cause the lock lever 16 to rotate in the direction indicated by the arrow 22 (FIG. 14) overcoming the pressure of the spring 18. As a result, the lock lever 16 is disengaged from the projection 15a of the side plate 1a. Therefore, the first slide arm 5 and the second slide arm 7 can be drawn out from the base frame 1 together with the circuit breaker 11.

After the above-mentioned state, that is the circuit breaker 11 is drawn out from the disconnected position, when the first slide arm 5 reaches the intermediate position shown in FIG. 18, the hook 12a of the lock plate 12 comes out of the front end of the lower support rail 3B, and the lock plate 12 rotates around the pivot pin 13 by the force of the lock spring 14 similarly to the aforementioned first embodiment. At the same time, the projection 12b of the lock plate 12 does not engage with the recess 7a of the second slide arm 7. The first slide arm 5 is inhibited from being drawn-out further from the intermediate position by a known stopper unit (not shown). As a result, only the second slide arm 7 can be slid along the first slide arm 5 by the sliding means of the first support pin 8 and the second support pin 10, which travel in the first slot 6 and the second slot 9, respectively. Consequently, the circuit breaker 11 is fully removed from the base frame 1 as the same drawout state shown in FIG. 19 as the aforementioned first embodiment shown in FIG. 1.

In the following paragraphs, a pushing-in operation for inserting the circuit breaker 11 to the base frame 1 of the drawout type switchgear in the drawn-out state shown in FIG. 19 is described. In the pushing-in operation, the first slide arm 5 is inhibited from moving in a backward direction (rightward in FIG. 19) by abutting between the hook 12a of the lock plate 12 and the front end of the lower support rail 3B as shown in FIG. 19. Therefore, when the circuit breaker 11 is pushed into the base frame 1, the second slide arm 7 is moved only in the backward direction.

When the second slide arm 7 reaches the intermediate position shown in FIG. 18, the second slide arm 7 abuts the lock plate 12. And the second slide arm 7 cause the lock plate 12 to rotate around the pivot pin 13 in the clockwise direction against the force of the lock spring 14. As a result, the hook 12a of the lock plate 12 disengages from the front end of the lower support rail 3B; and the second slide arm 7 and the first slide arm 5 are slid in so as to be received by the base frame 1.

In the pushing-in operation, the top end 16t of the lock lever 16 is pushed down by a front curved periphery of the projection 15a, and the lock lever 16 is rotated overcoming the force of the spring 18 in the direction indicated by the arrow 22 of FIG. 14 because the top end of the lock lever 16 moves along the front curved periphery of the projection 15a. And the top end 16t of the lock lever 16 overrides the projection 15a, thereby finally being caught by the projection 15a as shown in FIG. 14. FIG. 14 shows the disconnecting state of the drawout type switchgear.

As shown in FIG. 14, the lock lever 16 in the fifth embodiment is designed to be arranged behind the handle 19 of the second slide arm 7. Therefore, when the circuit breaker 11 is to be drawn out from the base frame 1 by using the handle 19, the lock lever 16 can be operated to be released by pulling forward (rightward in FIG. 14) by a finger of the operator while holding the handle 19. Accordingly, the release operation of the lock plate 16 and the drawout operation of the circuit breaker 11 are conducted by one motion by the operator. The drawout type switchgear of the fifth embodiment can realize an improved workability and a stabilization in the drawout operation.

Apart from the above-mentioned fifth embodiment wherein the sliding mechanism comprises a double slide structure of the first slide arm 5 and the second slide arm 7, a modified embodiment may be such that the sliding mechanism comprises a known single slide structure.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A drawout type switchgear comprising:
   a base frame having at least one side plate,
   a circuit breaker, which is movably mounted on said base frame, and which is to be locked at plural positions of a connected position, a disconnected position and a drawout position,
   an upper and a lower support rail mounted on said at least one side plate of said base frame,
   a first slide arm which is slidably supported by said upper and lower support rails,
   a second slide arm which is slidably supported by said first slide arm, and which is fixed to said circuit breaker, and
   at least one lock member which locks said second slide arm to said first slide arm until said first slide arm reaches a final drawout position of said first slide arm, and which releases by coming off said lower support rail.

2. A drawout type switchgear in accordance with claim 1, wherein
   said lock member, which is rotatably provided to said first slide arm, has a hook and a projection,
   and, when said hook slides to abut to a face of said lower support rail by a lock spring, said projection engages with said second slide arm to interlock said first slide arm and said second slide arm,
   and further, when said hook comes out from said face of said lower support rail at said final drawout position of said first slide arm, said hook is rotated to engage with said lower support rail by said lock spring and said projection disengages from said second slide arm.

3. A drawout type switchgear in accordance with claim 1 or 2, further comprising:
   a first support roller to contact to a lower face of said upper support rail provided at a back portion of said first slide arm,
   a second support roller to contact to a lower face of said first slide arm provided at a front position of said side plate of said base frame close to a front end of said lower support rail.

4. A drawout type switchgear in accordance with claim 1 or 2, wherein
   said first slide arm has a first slot for permitting therein traveling of a first support pin which supports said second slide arm,
   said second slide arm has a second slot for permitting therein traveling of a second support pin which is mounted on said first slide arm, and
   said first slot has a notch for inserting a head of said first support pin and said second slot has a notch for inserting a head of said second support pin.

5. A drawout type switchgear comprising:
   a base frame having at least one side plate, said at least one side plate comprising means defining a recess having a projection;
   a circuit breaker, which is movably mounted on said base frame, and which is to be locked at plural positions of a connection position, a disconnected position and a drawout position,
   at least one slide arm which is slidably supported by said at least one side plate of said base frame so as to hold said circuit breaker, and
   a lock lever unit which is provided on said at least one slide arm;
   biasing means for biasing said lock lever unit in a first direction;
   said lock lever unit comprising a first end engaging with said projection when said circuit breaker is disposed at said disconnected position to prevent rotation of said lock lever unit in a second direction opposite to said first direction and thereby to prevent further outward movement of said circuit breaker in the drawout direction.

6. A drawout type switch gear in accordance with claim 1, wherein said connected position is a position in which said circuit breaker is fully inserted in said base frame, said drawout position is a position in which said circuit breaker is fully extended outwardly from said base frame, and said disconnected position is a position in which said circuit breaker is between said connected position and said drawout position.

7. A drawout type switch gear in accordance with claim 2, wherein said connected position is a position in which said circuit breaker is fully inserted in said base frame, said drawout position is a position in which said circuit breaker is fully extended outwardly from said base frame, and said disconnected position is a position in which said circuit breaker is between said connected position and said drawout position.

8. A drawout type switch gear in accordance with claim 5, wherein said at least one slide plate comprises means defining a recess, said means defining a recess having a projection, and said lock lever unit comprises a first end which is adapted to engage with said projection when said circuit breaker is disposed at said disconnected position, to prevent further outward movement of said circuit breaker.

9. A drawout type switch gear in accordance with the apparatus of claim 5, wherein said connected position is a position in which said circuit breaker is fully inserted in said base frame, said drawout position is a position in which said circuit breaker is fully extended outwardly from said base frame, and said disconnected position is a position in which said circuit breaker is between said connected position and said drawout position.

10. A drawout type switch gear in accordance with the apparatus of claim 5, further comprising an upper and a lower slide support rail mounted on said at least one slide plate, and wherein said at least one slide arm comprises:
a first slide arm slidably supported by said upper and lower support rails; and
a second slide arm slidably supported by said first slide arm and fixed to said circuit breaker.

11. A drawout type switch gear in accordance with the apparatus of claim 10, wherein said circuit breaker can be locked in an intermediate position between said disconnected position, and said switchgear further comprises at least one lock member which locks said second slide arm to said first slide arm until said first slide arm reaches a final drawout position, such that said circuit breaker is locked in said intermediate position.

12. A drawout type switch gear in accordance with the apparatus of claim 11, wherein
said lock member, which is rotatably provided to said first slide arm, has a hook and a projection,
and, when said hook slides to abut to a face of said lower support rail by a lock spring, said projection engages with said second slide arm to interlock said first slide arm and said second slide arm,
and further, when said hook comes out from said face of said lower support rail at said final drawout position of said first slide arm, said hook is rotated to engage with said lower support rail by said lock spring and said projection disengages from said second slide arm.

13. A drawout type switchgear comprising:
a base frame having at least one side plate,
a circuit breaker, which is movably mounted on said base frame, and which is to be locked at plural positions of a connected position, a disconnected position and a drawout position,
an upper and a lower support rail mounted on said at least one side plate of said base frame,
a first slide arm which is slidably supported by said upper and lower support rails,
a second slide arm which is slidably supported by said first slide arm, and which is fixed to said circuit breaker, and
at least one lock member for locking said second slide arm to said first slide arm until said first slide arm reaches a final drawout position and for engaging with an upper surface of said lower support rail for locking said second slide arm in an extended position corresponding to the drawout position of said circuit breaker until said second slide arm is slid to abut said locking member causing said locking member to come off said lower support rail to release said locking member.

14. A drawout type switchgear in accordance with claim 13, further comprising a lock spring for biasing said lock member in a clockwise direction between said first slide arm and said lower slide rail, wherein
said lock member, which is rotatably supported on said first slide arm, comprises a hook at a first end thereof and a projection at a second end thereof,
and, when said hook is biased to abut to a face of said lower support rail by said lock spring, said projection engages with said second slide arm to interlock said first slide arm and said second slide arm to one another,
and further, when said hook comes off said face of said lower support rail at said final drawout position of said first slide arm, said hook is rotated to engage with said lower support rail by said lock spring and said projection disengages from said second slide arm.

15. A drawout type switchgear in accordance with claim 13, further comprising:
a first support roller for contacting a lower face of said upper support rail provided at a back portion of said first slide arm,
a second support roller for contacting a lower face of said first slide arm provided at a front position of said side plate of said base frame close to a front end of said lower support rail.

16. A drawout type switchgear in accordance with claim 14, wherein
said lower support rail is supported by and on an angle bar which connects between both side plates of said base frame, and
said upper support rail is supported by a cut and bent plate which is formed by bending a cut portion of said side plates.

17. A drawout type switchgear in accordance with claim 13, wherein
said first slide arm has a first slot for permitting therein traveling of a first support pin which supports said second slide arm,
said second slide arm has a second slot for permitting therein traveling of a second support pin which is mounted on said first slide arm, and
said first slot has a notch for inserting a head of said first support pin and said second slot has a notch for inserting a head of said second support pin.

* * * * *